United States Patent [19]
Barrett, Jr. et al.

[11] Patent Number: 5,422,911
[45] Date of Patent: Jun. 6, 1995

[54] FREQUENCY WALLED PHASE LOCK LOOP

[75] Inventors: Raymond L. Barrett, Jr., Ft. Lauderdale; Barry W. Herold, Boca Raton, both of Fla.

[73] Assignee: Motorola, Inc., Schaumburg, Ill.

[21] Appl. No.: 121,857

[22] Filed: Sep. 17, 1993

[51] Int. Cl.⁶ ................ H04L 27/152; H03L 7/107
[52] U.S. Cl. .................................. 375/327; 331/17; 455/260
[58] Field of Search ............... 375/81, 75; 455/260

[56] References Cited

U.S. PATENT DOCUMENTS

| | | | |
|---|---|---|---|
| 4,037,171 | 7/1977 | Cordell | 375/81 |
| 4,570,130 | 2/1986 | Grindel et al. | 331/17 |
| 4,652,875 | 3/1987 | Waki | 455/343 |
| 4,672,640 | 6/1987 | Meek et al. | 375/81 |
| 4,803,705 | 2/1989 | Gillingham et al. | 375/120 |
| 4,901,033 | 2/1990 | Herold et al. | 331/17 |
| 4,908,841 | 3/1990 | Leis et al. | 375/81 |
| 4,926,141 | 5/1990 | Herold et al. | 455/260 |
| 5,125,107 | 6/1992 | Herold et al. | 455/260 |
| 5,128,632 | 7/1992 | Erhart et al. | 455/260 |
| 5,258,933 | 11/1993 | Johnson et al. | 364/724.01 |
| 5,283,532 | 2/1994 | Burkhart et al. | 455/260 |
| 5,334,953 | 8/1994 | Mijuskovic | 331/17 |

Primary Examiner—Stephen Chin
Assistant Examiner—Jeffrey W. Gluck
Attorney, Agent, or Firm—Gregg E. Rasor

[57] ABSTRACT

A selective call receiver (100) includes a phase lock loop frequency synthesizer having a programmable output frequency signal (414) responsive to a control current signal (417). The phase lock loop frequency synthesizer includes a programmable gain current multiplier (412), a gain of which is determined by a control word selected such that a loop gain of the synthesizer remains relatively constant over a predetermined operating domain of a programmable output frequency signal (417). The current multiplier generates (412) the control current signal (417) by subtracting a reference current (415) from a limited current (416), thus bounding a range of the control current signal (417) within a maximum value of substantially the reference current (415) and a minimum value of the difference between the reference current (415) and the limited current (416).

7 Claims, 4 Drawing Sheets

FREQUENCY WALLED PHASE LOCK LOOP

FIELD OF THE INVENTION

This invention relates in general to phase lock loops and more particularly to a frequency walled phase lock loop for use in conjunction with a selective call receiver.

BACKGROUND OF THE INVENTION

In portable battery operated products such as a selective call receiver, it is desirable to have the lowest possible current drain in order to maximize battery life. Conventional selective call receivers may use conventional phase lock loop(s) to synthesize frequencies needed for digital logic or radio frequency circuits. These components operate in a fashion such that when switched from a first frequency to a second frequency, an output frequency is achieved relative to a reference frequency. The problem here is that during switching, the output frequency variations and ultimate tracking are limited by the loop response as determined by a loop filter. By design, conventional phase lock loops typically require a prescaler (commonly referred to as a divide-by-N counter) that scales the output frequency such that it may be coupled to a phase/frequency detector and the loop filter to control a voltage controlled oscillator. The voltage controlled oscillator in turn produces the output frequency responsive to the phase/frequency difference detected by the phase/frequency detector and further in response to the time and frequency domain characteristics of the loop filter. The components of the phase lock system, especially the loop filter, are typically designed for optimal performance at a selected divide-by-N count and corresponding output frequency. This constraint produces compromised performance at frequencies other than that produced by the selected divide-by-N count since the loop gain varies with respect to the division ratio selected. Moreover, since the filter topology is typically low pass, constraints on frequency variations due to overshooting or undershooting the desired frequency are primarily determined by the filter characteristics. Many artisans have, with no success, attempted to solve the problems associated with the above loop gain versus operating frequency compromise. Furthermore, conventional phase lock loop systems operating in the above described manner may, during the frequency switching mode, drive the voltage controlled oscillator's output frequency so far from the desired output frequency that the loop will lock on a spurious response or not at all.

Hence, conventional phase lock loop synthesizers do not minimize total power consumption because of their relatively uncontrolled variations during frequency locking and tracking. Attempts to improve power consumption and response characteristics have yielded topologies that are extremely complicated, requiring additional circuitry and more than eliminating any power saving and performance advantages gained.

Thus, what is needed is a phase lock loop frequency synthesizer topology that effectively conserves power while offering improved frequency switching, locking, and tracking characteristics.

SUMMARY OF THE INVENTION

Briefly, according to the invention, there is provided a phase lock loop frequency synthesizer having a programmable output frequency signal, the phase lock loop frequency synthesizer comprising:

a charge pump phase/frequency detector having a detector output signal representing a phase/frequency difference between a reference frequency signal and the programmable output frequency signal;

a voltage to current converter coupled to the charge pump phase/frequency detector for converting a bandlimited spectrum of a filter output voltage to a limited current representing the phase/frequency difference between the reference frequency signal and the programmable output frequency signal;

a programmable gain current multiplier coupled to the voltage to current converter, a gain of the programmable gain current multiplier being determined at least in part by a control word selected such that a loop gain of the phase lock loop frequency synthesizer remains relatively constant over a predetermined operating domain of the programmable output frequency signal, the programmable gain current multiplier operating to generate a control current signal by subtracting a reference current from a limited current, thus bounding a range of the control current signal within a maximum value of substantially the reference current and a minimum value of the difference between the reference current and the limited current;

a current controlled variable frequency oscillator coupled to the programmable gain current multiplier, the current controlled variable frequency oscillator producing the programmable output frequency signal in response to the control current signal; and a programmable frequency divider coupled to the current controlled variable frequency oscillator and a charge pump phase/frequency detector, the programmable frequency divider division ratio and scaled output feedback frequency being determined by the control word.

DESCRIPTION OF A PREFERRED EMBODIMENT

Figure 1:
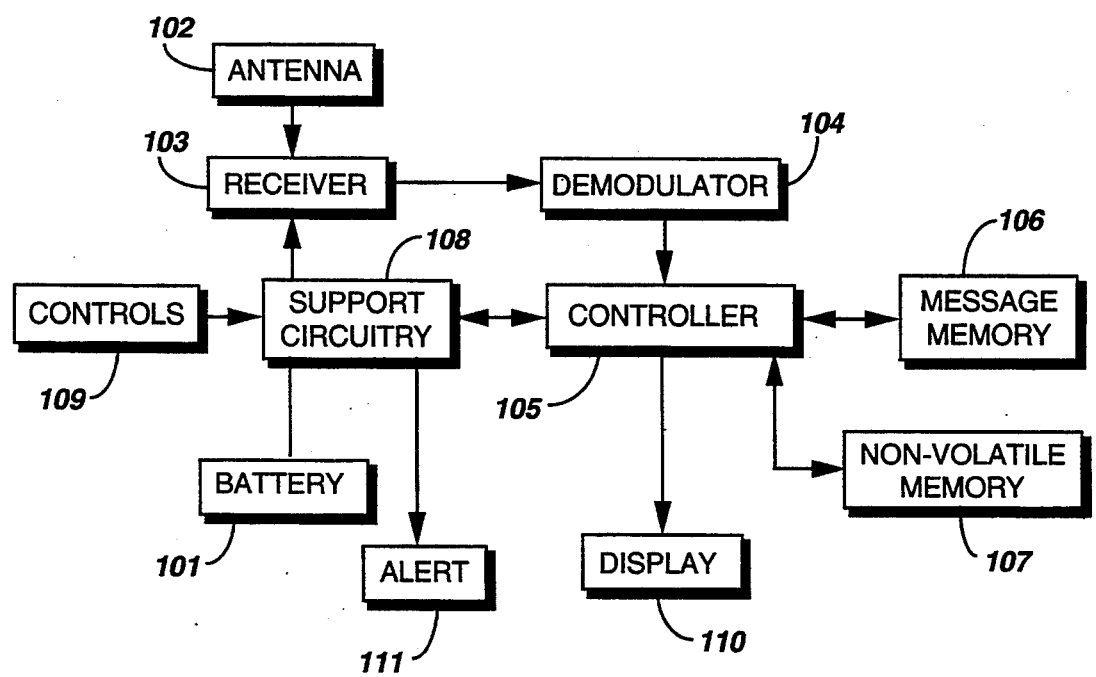
FIG. 1 is a block diagram of a selective call receiver suitable for use with the present invention.

Referring to FIG. 1, a battery 101 powered selective call receiver operates to receive a signal via an antenna 102. A receiver 103 couples a received signal to a demodulator 104, which recovers any information present using conventional techniques. The recovered information signal is coupled to a controller 105 that interprets and decodes the information contained therein. In the preferred embodiment, the controller 105 comprises a microprocessor having a signal processor (e.g., a decoder) implemented in both hardware and software.

The recovered information is checked by the decoder, which implements the signal processor for correlating a recovered address with a predetermined address. The nonvolatile memory 107 typically has a plurality of registers for storing the predetermined address and a plurality of configuration words that characterize the operation of the selective call receiver. In determining the selection of the selective call receiver, a correlation is performed between a recovered address contained within the information signal with a predetermined address corresponding to the selective call receiver. When the addresses substantially correlate, a detect is generated indicating selection of the selective call receiver and the controller 105 couples decoded message information to the message memory 106. In accordance with the recovered information, settings associated with the user controls 109, and detection, the support circuit 108 operates to process at least a portion of the message information for presentation, such as by a display 110, and may signal the user via an audible or tactile alert 111 that a message has been received. The user may view the information presented on the display 110 by activating the appropriate controls 109.

The support circuit 108 preferably comprises a conventional signal multiplexing integrated circuit, a voltage regulator that may supply a regulated voltage to portions of the support circuit 108, receiver 103, demodulator 104, or other selective call receiver components. Alternatively, the support circuit may be integrally coupled with the controller (e.g., a microcontroller includes features such as A/D, D/A converters, programmable I/O ports, a control buss, etc.). Furthermore, the support circuit 108 may include environmental sensing circuitry such as for light or temperature conditions, audio power amplifier circuitry, control interface circuitry, a clock frequency synthesizer, and display illumination circuitry. These elements are conventionally assembled to provide the information display receiver as requested by a customer.

Figure 2:
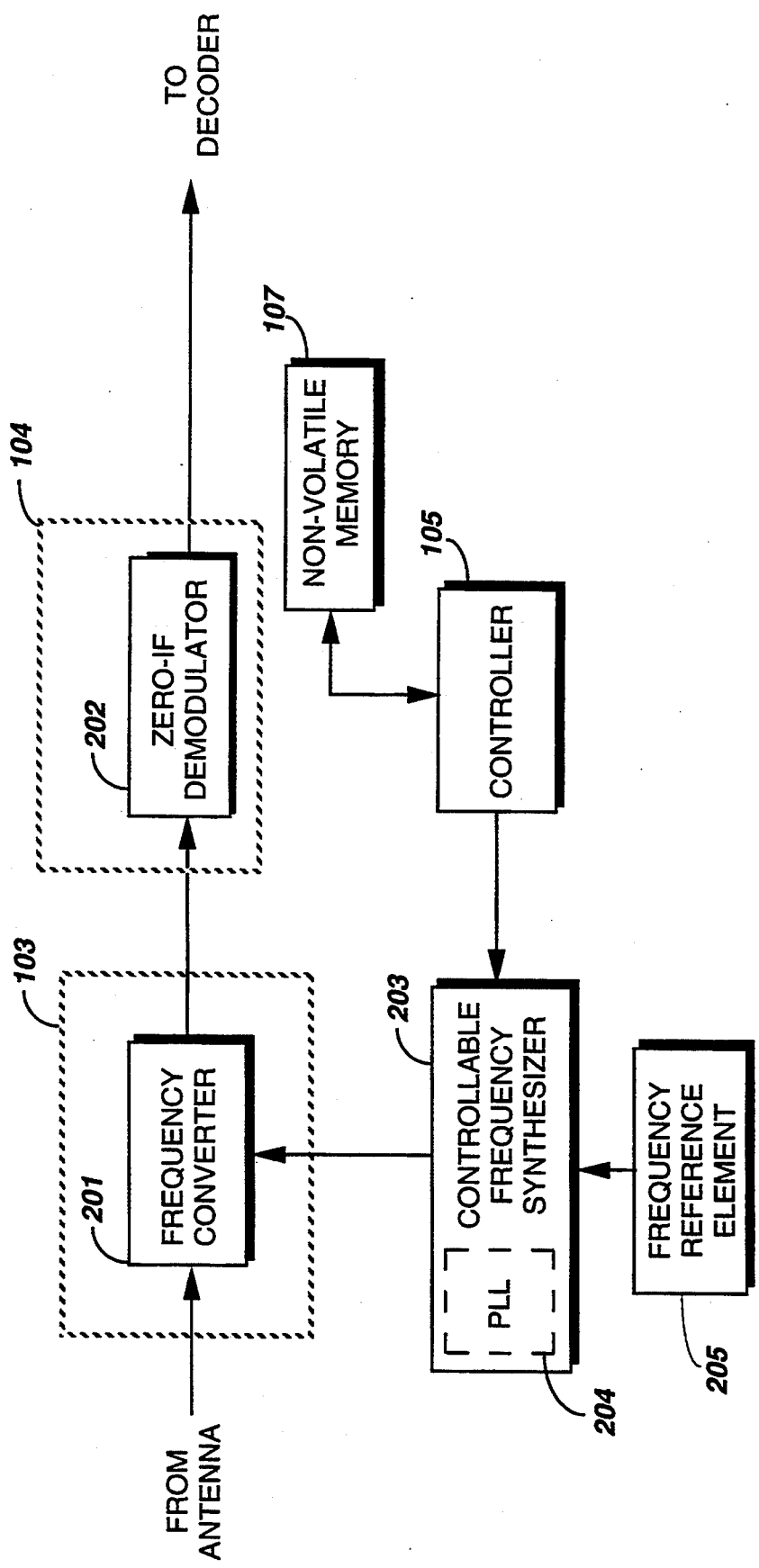
FIG. 2 is a partial block diagram of the selective call receiver depicted in FIG. 1 implementing a frequency synthesized zero-IF receiver in accordance with a first embodiment of the invention.

Referring to FIG. 2, the partial block diagram illustrates a frequency synthesized zero-IF receiver implemented in the selective call receiver depicted in FIG. 1, in accordance with a first embodiment of the invention.

A received signal that may include a modulated carrier signal is converted down to baseband using a conventional frequency converter 201. The resulting baseband signal is then demodulated using a conventional zero-if demodulator 202 such as a differentiate and cross-multiply topology or the like. The conversion is accomplished by mixing the received signal with a local oscillator signal provided by a controllable frequency synthesizer 203. In the preferred embodiment, the controllable frequency synthesizer 203 comprises a programmable phase lock loop synthesizer 204, using for example, at least one of a conventional divide-by-N prescaler, a dual modulus divider, or a fractional N division scheme such that the local oscillator signal frequency may be stepped in coarse or fine increments. The controllable frequency synthesizer 203 may also be used to synthesize any number of frequencies required to clock digital logic circuitry associated with other of the components comprising the selective call receiver (e.g., the decoder).

The controllable frequency synthesizer 203 is responsive to a controller module (e.g., an MC68HC05C4 manufactured by Motorola, Inc.) 105, that performs a sequence of decisions and controlling actions, as will be subsequently more fully discussed. The controller module 105 adjusts the local oscillator signal frequency by writing a control word (e.g., a divide factor) into the controllable frequency synthesizer 203, thereby programming the phase-locked loop 204 to a target frequency. The control word is derived from a relation between the frequency reference element 205 and the desired output frequency. The relation may be predetermined and its parameters stored in the non-volatile memory 107. The nonvolatile memory 107 may then be accessed by the controller 105 to program an output frequency of the programmable phase lock loop synthesizer 204.

Figure 3:
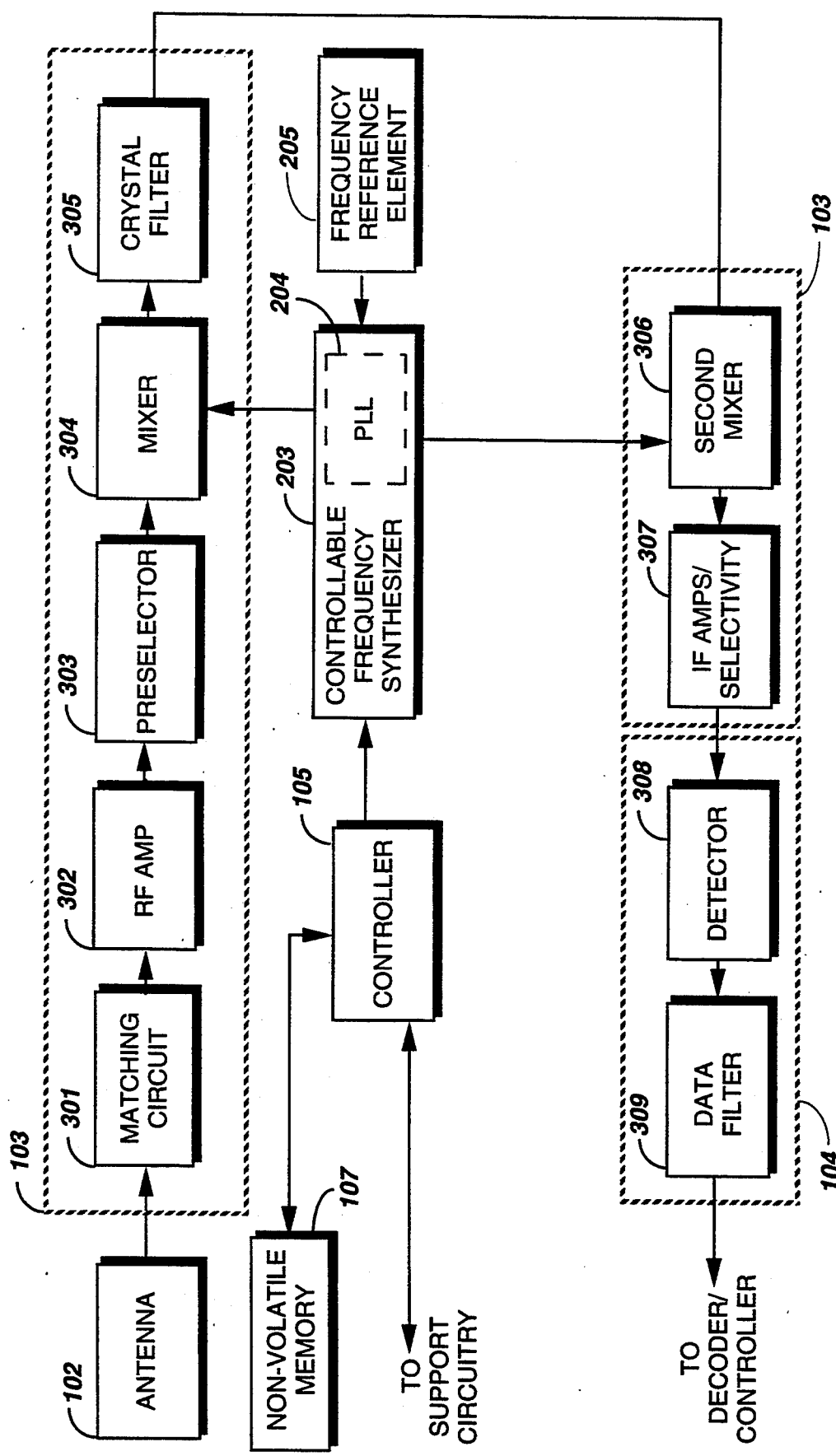
FIG. 3 is a partial block diagram of the selective call receiver depicted in FIG. 1 implementing a frequency synthesized dual conversion receiver in accordance with a second embodiment of the invention.

Referring to FIG. 3, the partial block diagram illustrates a frequency synthesized dual conversion receiver implemented in the selective call receiver depicted in FIG. 1, in accordance with a second embodiment of the invention.

The selective call receiver "RF front end" 301, 302, 303, 304, 305 is responsive to a transmitted signal that is received and coupled in via an antenna 102, as is commonly known in the art. The received signal from the antenna 102 may be optionally preconditioned using known techniques to provide an optimum signal level within a predetermined frequency bandwidth that is coupled to a first mixer 304.

The optional preconditioning of the received signal is usually performed by a matching circuit 301, a radio frequency amplifier 302, and a preselector filtering circuit 303, the design and function of these circuits being generally well known in the art. The matching circuit 301 matches the antenna 102 impedance characteristics to the RF amplifier 302. Preferably, the matching circuit is designed to provide the RF amplifier 302 with an optimum noise match (minimum noise figure) and low insertion loss, thereby optimally delivering the received signal power from the antenna 102 to the RF amplifier 302. The amplified signal can then be coupled to a preselector filtering circuit 303 that accepts a desired signal with minimal attenuation (e.g., within a predetermined frequency band) and attenuates (i.e., rejects) all undesired signals. Consequently, the received signal is preconditioned and coupled to the first signal mixer 304.

The first mixer 304 subsequently mixes the preconditioned received signal with a first local oscillator injection signal provided by the controllable frequency synthesizer 203. The controllable frequency synthesizer has an output frequency derived from the frequency reference element 205. The resulting conversion generates a first intermediate frequency signal that is subsequently coupled to a crystal filter 305 that passes the first intermediate frequency signal and attenuates any undesired signals such as the first mixer image signal and the first local oscillator injection signal.

A second mixer 306 mixes the first intermediate frequency signal with a second local oscillator injection signal provided by the controllable frequency synthesizer 203. The resulting second intermediate frequency signal is typically filtered and amplified (i.e., by an intermediate frequency amplifying and filtering circuit 307) and coupled to the demodulator 104. The demodulator in this embodiment comprises a modulation detector 308 that recovers information (i.e., FSK digital data, audio tones, PSK digital data, SSB, etc.) that is coupled to a decoder via a data filter 309 in a manner well known in the art.

In performing frequency selection, the controller 105 is coupled to the controllable frequency synthesizer 203 including the phase lock loop 204. The controller operates to execute a microcode program that generates a frequency control signal. The frequency control signal serves to program the output frequency of the controllable frequency synthesizer 203 to reflect a frequency error of substantially zero parts per million with respect to a desired operating frequency (e.g., the local oscillator frequency, clock frequency, or the like).

The non-volatile memory (e.g., read only memory, backed-up random access memory, EEPROM, or the like) 107 may provide storage for executable controller instructions, storage for a table representing programmed output frequencies and their corresponding control word(s) (e.g., divide factors), and storage for non-volatile configuration information that may be necessary to perform the decisions and actions in the control process, as will be subsequently more fully discussed.

Figure 4:
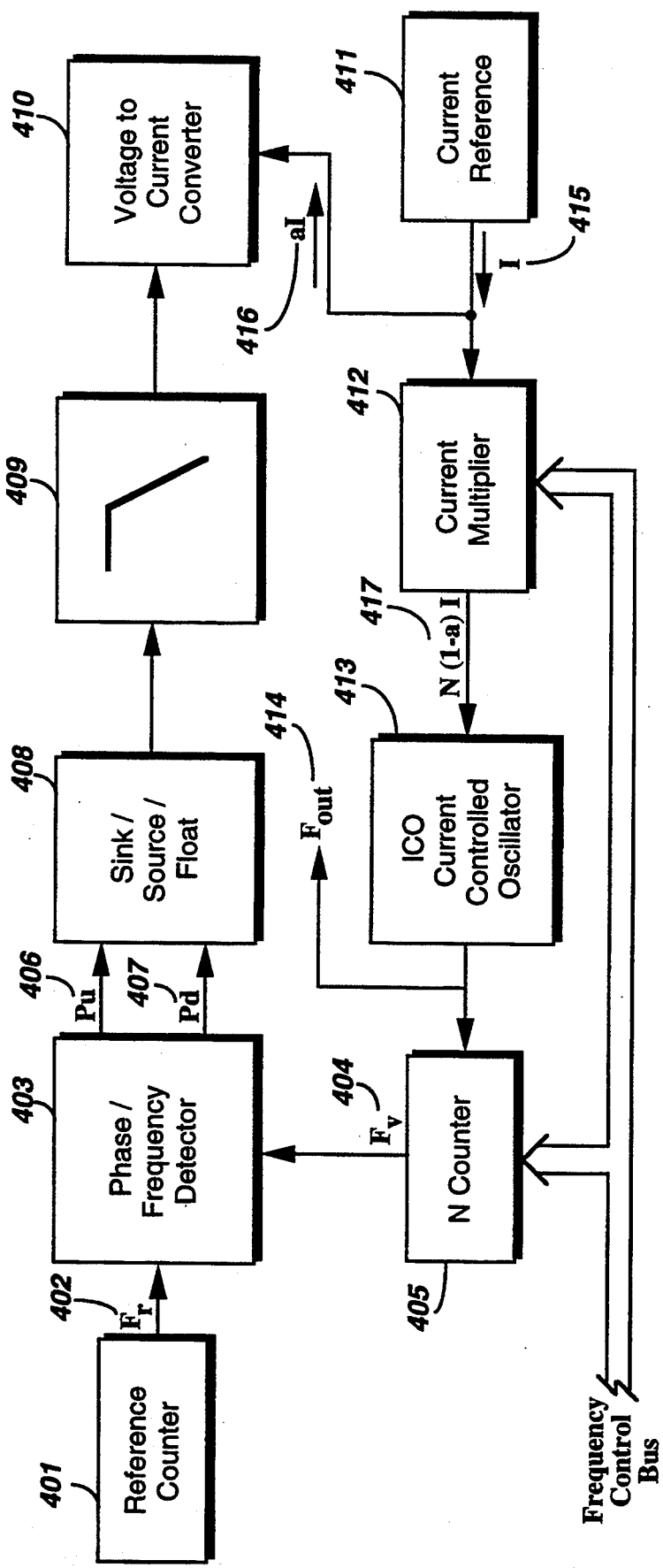
FIG. 4 is a block diagram of a frequency walled phase lock loop in accordance with the preferred embodiment of the present invention.

Referring to FIG. 4, the block diagram illustrates a frequency walled phase lock loop in accordance with the preferred embodiment of the present invention.

The frequency walled phase lock loop 204 operates as part of the controllable frequency synthesizer 203 and may generate an output signal that can be used for a local oscillator frequency source, clock frequency source (for digital or analog circuitry), or the like.

Operationally, the reference counter 401 divides the reference frequency (from the frequency reference element 205) down to a the frequency increment required by the phase lock loop system. The output of the reference counter, Fr 402, is coupled to and activates a phase/frequency detector 403 in a frequency increase mode. The phase/frequency detector 403 monitors the Fr (reference frequency) 402 and Fv (scaled output feedback frequency) 404 signals from the reference counter 401 and an N counter 405, and provides pump up, Pu 406, and pump down, Pd 407, signals to the sink-source-float block 408. The Pu 406 and Pd 407 signals provide an indication of the phase error between the input signals Fr 402 and Fv 404. Thus, the Pu 406 signal is activated when the Fr 402 signal occurs and until the Fv 404 signal occurs. Similarly, the Pd 407 signal is activated when the Fv 404 signal occurs and until the Fr 402 signal occurs. This effectively controls the operation of a sink-source-float block 408.

The sink-source-float block 408 provides sink and source currents depending upon the states of signals Pu 406 and Pd 407. When the Pu 406 signal activated, the sink-source-float block 408 provides a sink current. When the Pd 407 signal is activated, the sink-source-float block 408 provides a source current. When both Pu 406 and Pd 407 are not active, the output of the sink-source-float block 408 is in a tri-state (high impedance) mode.

The output of the sink-source-float block 408 is coupled to a filter 409 that converts the current from the sink-source-float block 408 into a stable voltage for loop dynamic control. The output of the filter 409 is then coupled to a voltage to current converter 410 that transforms the filter voltage into an output current 416 used in controlling the oscillator.

The output current 416 from the voltage to current converter 410 is subtracted from a current 415 generated by a current reference 411 to generate a control current 417 that sets the output frequency of a current controlled oscillator 413. The voltage to current converter 410 output current is set to a maximum value of 50% of the reference current. This provides a restricted current swing (restricted domain) to obtain the walled operation, thus allowing the frequency of the current controlled oscillator 413 to vary only within the bounds of the voltage to current converter 410 output current. This operation inherently improves phase lock loop performance by limiting the maximum frequency excursion, thus allowing for faster frequency lock times.

The control current 417, as noted before, is generated by subtracting the output current 416 from the current 415 generated by the current reference 411. This subtraction takes place in conjunction with a current multiplier 412. The current multiplier utilizes the same programmed frequency control word coupled to the N counter to change the loop gain in step with a frequency change. This provides significantly improved loop performance over a wide frequency range by holding the loop gain relatively constant, thus retaining optimal response (settling) times and minimum frequency overshoot and undershoot.

A selective call receiver comprising a receiver 103 for providing a received signal; a demodulator 104 for recovering the received signal and providing an information signal; a decoder 105 for correlating a recovered address contained within the information signal with a predetermined address corresponding to the selective call receiver, and responsive to said addresses substantially correlating, generating a detection indicating selection of the selective call receiver; and a support circuit 108 to process information for presentation in response to the detection, embodies the preferred environment for implementing the phase lock loop frequency synthesizer. In this case, the a phase lock loop frequency synthesizer, having a programmable output frequency signal usable by at least the receiver 103, the decoder 105, and the support circuit 108, comprises: a charge pump phase/frequency detector 403, 408 having a detector output signal representing a phase/frequency difference between a reference frequency signal 402 and the programmable output frequency signal 414; a voltage to current converter 410 coupled to the charge pump phase/frequency detector for converting a band-limited spectra of a filter output voltage to a limited current representing the phase/frequency difference between the reference frequency signal 402 and the programmable output frequency signal 414; a programmable gain current multiplier 412 coupled to the voltage to current converter, a gain of the programmable gain current multiplier being determined at least in part by a control word selected such that a loop gain of the phase lock loop frequency synthesizer remains relatively constant over a predetermined operating domain of the programmable output frequency signal 414, the programmable gain current multiplier 412 operating to generate a control current signal 417 by subtracting a reference current 415 from a limited current 416, thus bounding a range of the control current signal within a maximum value of substantially the reference current 415 and a minimum value of the difference between the reference current 415 and the limited current 416; a current controlled variable frequency oscillator 413 coupled to the programmable gain current multiplier 412, the current controlled variable frequency oscillator producing the programmable output frequency signal 414 in response to the control current signal 417; and a programmable frequency divider 405 coupled to the current controlled variable frequency oscillator 413 and a charge pump phase/frequency detector 403, the programmable frequency divider division ratio and scaled output feedback frequency 404 being determined by the control word.

In summary, the frequency walled phase lock loop uses the difference of the limited current aI 416 from the voltage to current converter 410 (where a<1.0) and a smaller, limited, unipolar current I 417 from the current reference 411, to generate the control current N(1-a)I 417, where the value of N, the programmed frequency control word, acts as a multiplier that compensates for the loop gain change caused by decreasing or increasing the divider ratio. In this manner, the maximum available output current from the current multiplier 412 is limited to the value of the unipolar current I 415 while the value of the limited current aI 416 from the voltage to current converter 410 is zero, and similarly, the minimum available output current from the current multiplier 412 is limited to the difference between the limited current aI 416 from the voltage to current converter 410 and the unipolar current I 415 from the current reference 411 when the limited current aI 416 is at its maximum value.

The programmable current gain block (current multiplier) 412 is inserted in the loop between the voltage to current conversion operation of the loop filter (voltage to current converter 410) and the current controlled oscillator 413. The programmable current gain block 412 is programmed by the same programming information as the programmable frequency divider (N counter) 405.

It is well known that the inclusion of a frequency divider in a phase lock loop alters the loop gain as a consequence of the division ratio, and the programmable current gain block 412 compensates for this change in loop gain. Thus, with a more nearly constant loop gain, the overshoot of the loop dynamics can be limited by appropriate choice of damping factor.

The inclusion of the programmable current gain block 412 also allows the range of frequencies spanned by the current controlled oscillator 413 to be altered inversely in proportion to the division ratio of the programmable frequency divider 405, thereby maintaining the maximum and minimum current controlled oscillator output frequencies (and overshoot) to an amount proportional to the nominal locked operating frequency.

This topology places inherent limits on the current controlling the current controlled oscillator. Therefore, the frequency "walls," as implied by the maximum and minimum available currents, prevent transient excursions of the oscillator frequency too far outside what is considered a normal operating range, thus allowing the synthesizer to operate more efficiently from both a power saving and raw synthesizer performance standpoint.

We claim:

1. A phase lock loop frequency synthesizer having a scalable output frequency signal, the phase lock loop frequency synthesizer comprising:
    a charge pump phase/frequency detector having a detector output signal representing a phase/frequency different between a reference frequency signal and the scalable output frequency signal;
    a voltage to current converter coupled to the charge pump phase/frequency detector for converting a band-limited spectrum to a limited current representing the phase/frequency difference between the reference frequency signal and the scalable output frequency signal;
    a programmable gain current multiplier coupled to the voltage to current converter, a gain of the programmable gain current multiplier being determined at least in part by a control word selected such that a loop gain of the phase lock loop frequency synthesizer remains relatively constant over a predetermined operating domain of the scalable output frequency signal, the programmable gain current multiplier operating to generate a control current signal by subtracting a reference current from a limited current, thus bounding a range of the control current signal within a maximum value of substantially the reference current and a minimum value of the difference between the reference current and the maximum value of the limited current;
    a current controlled variable frequency oscillator coupled to the programmable gain current multiplier, the current controlled variable frequency oscillator producing the scalable output frequency signal in response to the control current signal; and
    a programmable frequently divider coupled to the current controlled variable frequency oscillator and a charge pump phase/frequency detector, the programmable frequency divider division ratio and scaled output feedback frequency being determined by the control word.

2. The phase lock loop frequency synthesizer according to claim 1 further comprising:
    a frequency reference that provides the reference frequency signal.

3. The phase lock loop frequency synthesizer according to claim 1 further comprising:
    a voltage mode loop filter coupled to the charge pump phase/frequency detector, the voltage mode loop filter operating to band-limit the spectrum corresponding with the current mode detector output signal and further to generate a filter output voltage that is subsequently converted to the limited current by the voltage to current converter.

4. A selective call receiver, comprising;
    a receiver for providing a received signal;
    a demodulator for recovering the received signal and providing an information signal;
    a detector for correlating a recovered address contained within the information signal with a predetermined address corresponding to the selective call receiver, and responsive to said addresses substantially correlating, generating a detection signal indicating selection of the selective call receiver;
    a support circuit to process information for presentation in response to the detection signal; and
    a phase lock loop frequency synthesizer having a scalable output frequency signal usable by at least the receiver, the decoder, and the support circuit, the phase lock loop frequency synthesizer comprising:
    a charge pump phase/frequency detector having a detector output signal representing a phase/frequency difference between a reference frequency signal and the scalable output frequency signal;
    a voltage to current converter coupled to the charge pump phase/frequency detector for converting a band-limited spectrum to a limited current representing the phase/frequency difference between the reference signal and the scalable output frequency signal;
    a programmable gain current multiplier coupled to the voltage to current converter, a gain of the programmable gain current multiplier being determined at least in part by a control word selected such that a loop gain of the phase lock loop frequency synthesizer remains relatively constant over a predetermined operating domain of the scalable output frequency signal, the programmable gain current multiplier operating to generate a control current signal by subtracting a reference current from a limited current, thus bounding a range of the control current signal within a maximum value of substantially the reference current and a minimum value of the difference between the reference current and the maximum value of the limited current;

a current controlled variable frequency oscillator coupled to the programmable gain current multiplier, the current controlled variable frequency oscillator producing the scalable output frequency signal in response to the control current signal; and a programmable frequency divider coupled to the current controlled variable frequency oscillator and a charge pump phase/frequency detector, the programmable frequency divider division ratio and scaled output feedback frequency being determined by the control word.

5. The selective call receiver according to claim 4 wherein the phase lock loop frequency synthesizer further comprises:

a frequency reference that provides the reference frequency signal.

6. The selective call receiver according to claim 4 wherein the phase lock loop frequency synthesizer further comprises:

a voltage mode loop filter coupled to the charge pump phase/frequency detector, the voltage mode loop filter operating to band-limit the spectrum corresponding with the current mode detector output signal and further to generate a filter output voltage that is subsequently converted to the limited current by the voltage to current converter.

7. A phase loop frequency synthesizer having a scalable output frequency signal, the phase lock loop frequency synthesizer comprising:

a frequency reference that provides a reference frequency signal;

a charge pump phase/frequency detector coupled to the frequency reference, the charge pump phase/frequency detector having a current mode detector output signal representing a phase/frequency difference between the reference frequency signal to the scalable output frequency signal;

a voltage mode loop filter coupled to the charge pump phase/frequency detector, the voltage mode loop filter operating to band-limit a spectrum corresponding with the current mode detector output signal and further to generate a filter output voltage;

a voltage to current converter coupled to the voltage mode loop filter for converting the band-limited spectrum of the filter output voltage to a limited current representing the phase/frequency difference between the frequency signal and the scalable output frequency signal;

a programmable gain current multiplier coupled to a current reference that produces a reference current, a gain of the programmable gain current multiplier being determined at least in part by a control word selected such that a loop gain of the phase lock loop frequency synthesizer remains relatively constant over a predetermined operating domain of the scalable output frequency signal, the programmable gain current multiplier operating to generate a control current signal by subtracting the reference current from the limited current, thus bounding a range of the control current signal within a maximum value of substantially the reference current and a minimum value of the difference between the reference current and the maximum value of the limited current;

a current controlled variable frequency oscillator coupled to the programmable gain current multiplier, the current controlled variable frequency oscillator producing the scalable output frequency signal in response to the control current signal; and a programmable frequency divider coupled to the current controlled variable frequency oscillator and the charge pump phase/frequency detector, the programmable frequency divider division ratio and scaled output feedback frequency being determined by the control word.

* * * * *

UNITED STATES PATENT AND TRADEMARK OFFICE
CERTIFICATE OF CORRECTION

PATENT NO. : 5,422,911
DATED : June 6, 1995
INVENTOR(S) : Raymond L. Barrett, Jr., et al.

It is certified that error appears in the above-indentified patent and that said Letters Patent is hereby corrected as shown below:

Column 7, line 57, delete "different" and insert --difference--.

Column 8, line 62, after reference insert --frequency--.

Column 10, line 3, after signal delete "to" and insert --and--.

Signed and Sealed this

Second Day of January, 1996

*Attest:*

BRUCE LEHMAN

*Attesting Officer*     *Commissioner of Patents and Trademarks*